United States Patent
Stiegler et al.

(10) Patent No.: US 8,908,412 B2
(45) Date of Patent: Dec. 9, 2014

(54) ARRAY ARCHITECTURE FOR REDUCED VOLTAGE, LOW POWER, SINGLE POLY EEPROM

(75) Inventors: Harvey J. Stiegler, Plano, TX (US); Allan T. Mitchell, Heath, TX (US)

(73) Assignee: Texas Instruments Incorporated, Dallas, TX (US)

( * ) Notice: Subject to any disclaimer, the term of this patent is extended or adjusted under 35 U.S.C. 154(b) by 399 days.

(21) Appl. No.: 12/804,439

(22) Filed: Jul. 20, 2010

(65) Prior Publication Data

US 2012/0020163 A1  Jan. 26, 2012

(51) Int. Cl.
  *G11C 17/00*  (2006.01)
  *G11C 16/04*  (2006.01)

(52) U.S. Cl.
  CPC .................................. *G11C 16/0441* (2013.01)
  USPC ......................................................... 365/102

(58) Field of Classification Search
  CPC ........... G11C 16/0441; G11C 16/0425; G11C 16/0433
  USPC ....................................... 365/189.18, 185.21
  See application file for complete search history.

(56) References Cited

U.S. PATENT DOCUMENTS

| | | |
|---|---|---|
| 4,924,278 A | 5/1990 | Logie |
| 5,615,150 A | 3/1997 | Lin et al. |
| 5,892,709 A | 4/1999 | Parris et al. |
| 5,940,324 A | 8/1999 | Chi et al. |
| 5,959,889 A * | 9/1999 | Ratnakumar ............ 365/185.18 |
| 6,028,789 A | 2/2000 | Mehta et al. |
| 6,704,221 B2 | 3/2004 | Killat |
| 6,930,002 B1 | 8/2005 | Chen et al. |
| 2001/0042883 A1 * | 11/2001 | Li et al. .......................... 257/321 |
| 2006/0221668 A1 * | 10/2006 | Taguchi .......................... 365/149 |
| 2008/0001199 A1 * | 1/2008 | Hoefler ......................... 257/300 |
| 2010/0039868 A1 * | 2/2010 | Mitchell et al. .......... 365/185.28 |

FOREIGN PATENT DOCUMENTS

| | | |
|---|---|---|
| EP | 0295935 A1 | 12/1988 |
| JP | 10335505 A | 12/1998 |

* cited by examiner

*Primary Examiner* — Vanthu Nguyen
*Assistant Examiner* — Khamdan Alrobaie
(74) *Attorney, Agent, or Firm* — Rose Alyssa Keagy; Frederick J. Telecky, Jr.

(57) ABSTRACT

An Electrically Erasable Programmable Read Only Memory (EEPROM) memory array (FIG. 7) is disclosed. The memory array includes a plurality of memory cells arranged in rows and columns. Each memory cell has a switch (714), an access transistor (716), and a sense transistor (720). A current path of each access transistor is connected in series with a current path of each respective sense transistor. A first program data lead (706) is connected to the switch of each memory cell in a first column. A bit line (718) is connected to the current path of each access transistor in the first column. A read select lead (721) is connected to a control terminal of each access transistor in the first row. A first row select lead (700) is connected to a control terminal of the switch in each memory cell in a first row.

21 Claims, 10 Drawing Sheets

ARRAY ARCHITECTURE FOR REDUCED VOLTAGE, LOW POWER, SINGLE POLY EEPROM

CROSS-REFERENCE TO RELATED APPLICATIONS

Cross-reference is made to commonly assigned U.S. Pat. No. 8,174,884 entitled "LOW POWER, SINGLE POLY EEPROM CELL WITH VOLTAGE DIVIDER" granted May 8, 2012, the teachings of which are incorporated herein by reference in their entirety.

BACKGROUND OF THE INVENTION

Embodiments of the present invention relate to an Electrically Erasable Programmable Read Only Memory (EEPROM) array architecture for a cell having a single polycrystalline silicon gate.

Contemporary semiconductor integrated circuits typically perform much more complex functions than previous designs. Mixed mode circuits performing combined analog, digital, and memory functions are common for many applications. At the same time these mixed mode circuits must keep the manufacturing process as simple as possible to reduce cost and improve the process yield. A single polycrystalline silicon EEPROM cell of the prior art that may be compatible with existing complementary metal oxide silicon (CMOS) processes is illustrated at FIG. 9. The cell includes complementary floating gates 912 and 914 which serve as control gates for respective sense transistors. During a read operation, these sense transistors are accessed by read select transistors which connect the sense transistors to bitline (BL) and complementary bitline (BL_) terminals. Each cell includes a control circuit 920 which receives global address and control signals and produces local control signals for the respective cell. Programming is accomplished, for example, by driving WR1_low, WR_EN1 high, and WR_EN2 low. In this state, N-channel transistor 908 is on and N-channel transistor 910 is off. Reference transistors 904 and 906 couple low and high signals between respective P-channel and N-channel transistors. Responsively, P-channel transistor 902 is on and P-channel transistor 900 is off. This programs positive charge on floating gate 912 and negative charge on floating gate 914. One disadvantage of this cell is that it requires a separate control circuit 920 for each cell. Another disadvantage is that it requires substantial layout area for the complementary floating gates 912 and 914. Yet another disadvantage of this cell is that transistors 904 through 910 are constructed as large drain-extended transistors indicated by asterisks to preclude punch through at relatively high drain-to-source voltages.

Other single polycrystalline silicon EEPROM cells of the prior art may be manufactured together with analog and digital circuits on a single integrated circuit. Such EEPROM cells permit nonvolatile memory to be formed in mixed mode circuits for many applications. Chi et al. (U.S. Pat. No. 5,940,324) and Chen et al. (U.S. Pat. No. 6,930,002) both developed single polycrystalline silicon EEPROM cells that are programmed by band-to-band tunneling. The present inventors have developed an improved array architecture for a single polycrystalline silicon EEPROM cell that offers several advantages over single polycrystalline silicon memory cells of the prior art as will become apparent in the following discussion.

BRIEF SUMMARY OF THE INVENTION

In a preferred embodiment of the present invention, an Electrically Erasable Programmable Read Only Memory (EEPROM) array is disclosed. The memory array includes a plurality of memory cells arranged in rows and columns. Each memory cell has a switch, an access transistor, and a sense transistor. A current path of each access transistor is connected in series with a current path of each respective sense transistor. A first program data lead is connected to the switch of each memory cell in a first column. A bit line is connected to the current path of each access transistor in the first column. A read select lead is connected to a control terminal of each access transistor in the first row. A first row select lead is connected to a control terminal of the switch in each memory cell in a first row. The memory array prevents stress on unselected memory cells during programming of selected memory cells.

DETAILED DESCRIPTION OF THE INVENTION

Figure 1:
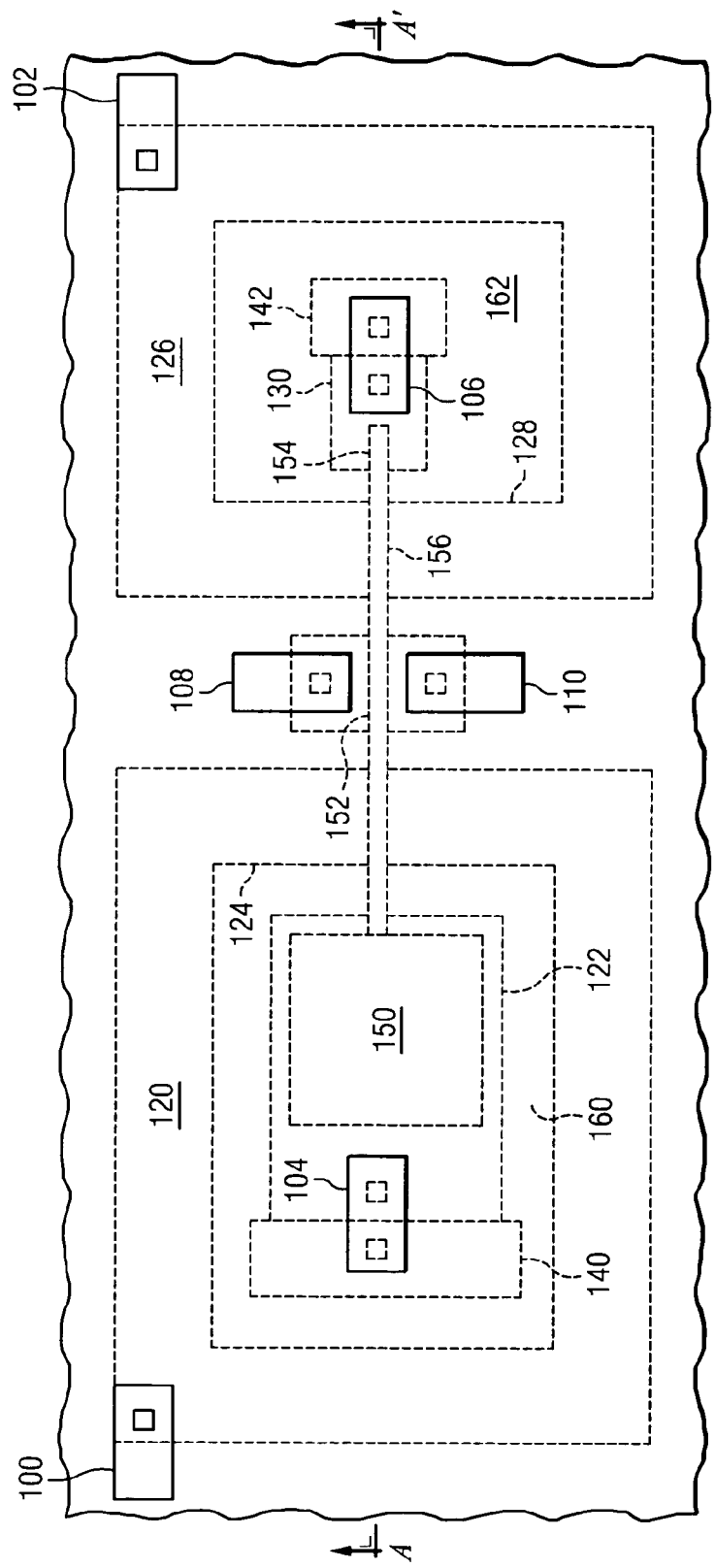
FIG. 1 is a top view of a single polycrystalline silicon gate EEPROM cell that may be used with the present invention.

Preferred embodiments of the present invention provide significant advantages over previous memory array architectures using single polycrystalline silicon EEPROM memory cells as will become evident from the following detailed description. The present inventors have disclosed a single polycrystalline silicon EEPROM cell in U.S. patent application Ser. No. 12/462,076, filed Jul. 28, 2009, and incorporated herein by reference in its entirety. The following discussion briefly describes that EEPROM memory cell to provide a more complete understanding of the present invention. In the following discussion, P and N are used to indicate semiconductor conductivity type. A "+" or "−" sign after the conductivity type indicates a relatively high or low doping concentration, respectively, of the semiconductor region.

Furthermore, the same reference numerals are used in the drawing figures to indicate common circuit elements.

Referring to FIG. 1, there is a top view of a single polycrystalline silicon gate (Poly) EEPROM memory cell that may be used with the present invention. The cell includes N− isolation regions 120 and 126. These N− isolation regions serve to electrically isolate P− well regions 160 and 162, respectively, from a P type substrate. In operation, they are preferably biased to a positive supply voltage at terminals 100 and 102. A control gate terminal 104 contacts P+ region 140 as well as N+ region 122, both of which are formed within P− well region 160. A tunnel gate terminal 106 contacts P+ region 142 as well as N+ region 130, both of which are formed within P− well region 162. A single polycrystalline silicon gate layer 156 overlies a part of both P− well regions and is self aligned with N+ regions 122 and 130. An N-channel sense transistor is formed between the P− well regions 160 and 162. The sense transistor includes drain terminal 108, source terminal 110, and control gate 152. The sense transistor operates to indicate the data state of the polycrystalline silicon gate layer 156 as will be explained in detail.

Figure 2:
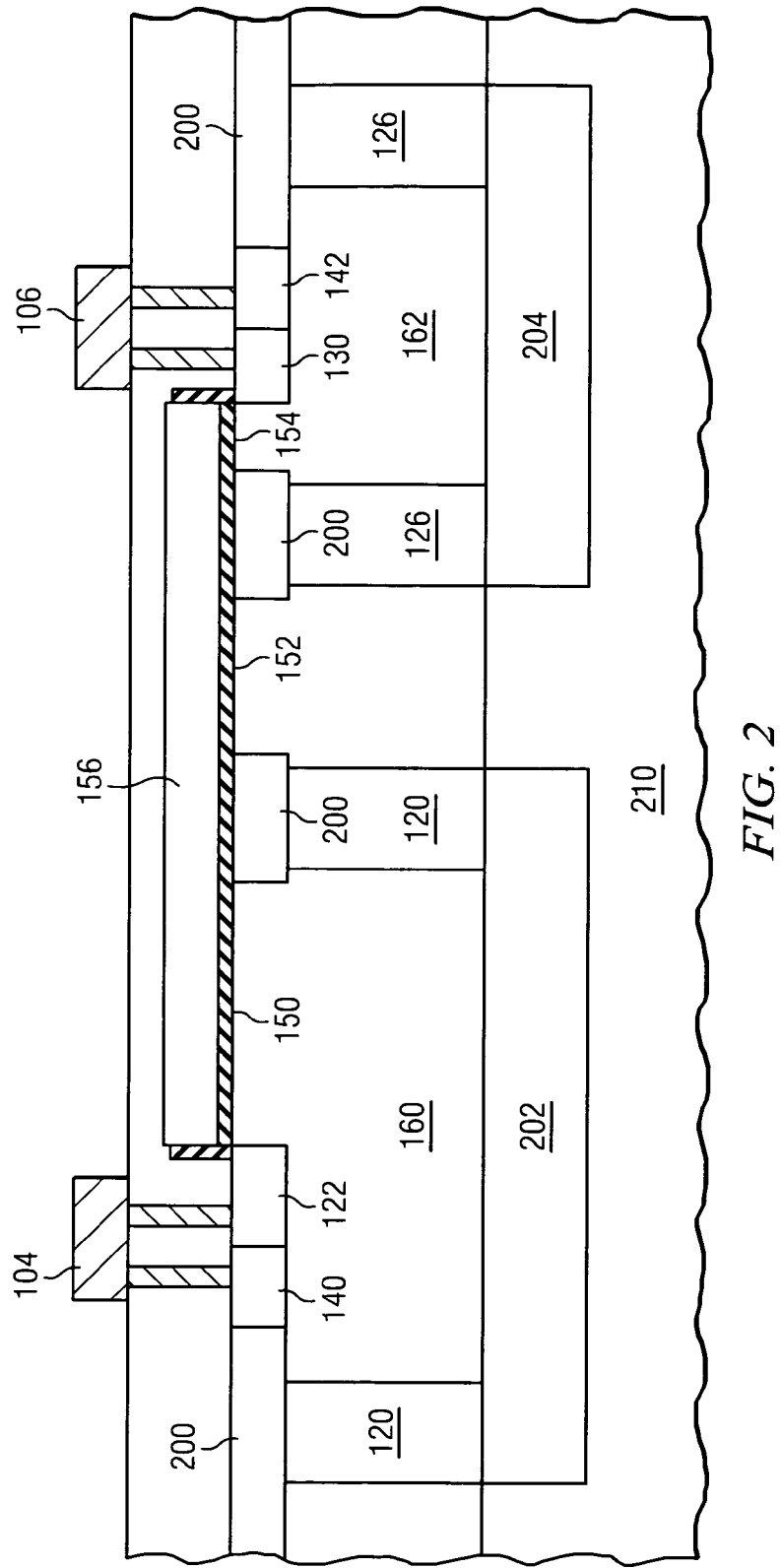
FIG. 2 is a cross sectional view of the EEPROM cell of FIG. 1 at the plane A-A'.

The polycrystalline silicon gate layer 156 is often referred to as a floating gate, since it is only capacitively coupled and not directly connected to other elements of the memory cell. The polycrystalline silicon gate forms one terminal of a control gate capacitor 150 as well as one terminal of a tunnel gate capacitor 154. Referring now to FIG. 2, there is a cross sectional view of the EEPROM cell of FIG. 1 at the plane A-A'. An N+ buried layer 202 together with N− isolation region 120 electrically isolates P− well region 160 from P substrate 210. Likewise, another N+ buried layer 204 together with N− isolation region 126 electrically isolates P− well region 162 from P substrate 210. Shallow trench isolation regions 200 isolate active regions such as control gate capacitor 150, sense transistor 152, and tunnel gate capacitor 154. An upper plate of the control gate capacitor is formed by a first part of polycrystalline silicon gate layer 156. A lower plate of the control gate capacitor to is formed adjacent the upper plate by P− well region 160. The upper and lower plates are separated by a dielectric region to form the control gate capacitor 150. In a similar manner, an upper plate of the tunnel gate capacitor 154 is formed by a second part of polycrystalline silicon gate layer 156. A lower plate of the tunnel gate capacitor 154 is formed adjacent the upper plate by P− well region 162. The upper and lower plates are separated by a dielectric region to form the tunnel gate capacitor 154.

Figure 3:
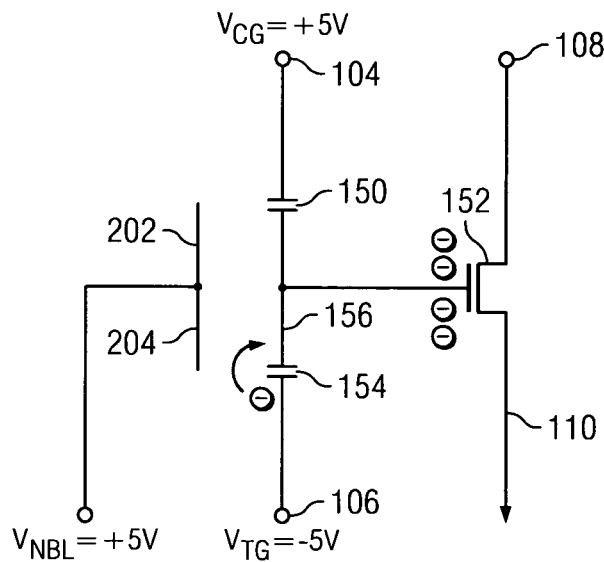
FIG. 3 is a schematic diagram showing programming a logical zero (program) in the EEPROM cell.
Figure 4:
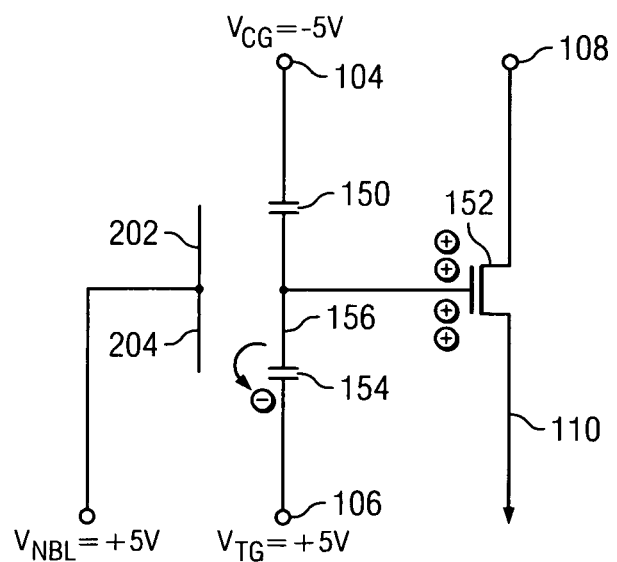
FIG. 4 is a schematic diagram showing programming of a logical one (erase) in the EEPROM cell.

Referring now to FIGS. 3 and 4, a programming operation of the control gate layer of the memory cell will be explained in detail. Numeric voltage values in the following discussion and throughout the instant specification are given by way of example for the purpose of illustration and may vary with different manufacturing processes. FIG. 3 is a schematic diagram of the memory cell of FIGS. 1-2. N− isolation regions 120 and 126 as well as N+ buried layers 202 and 204 are biased at 5 V throughout the operation. A 5 V signal is applied to control gate terminal 104. P+ region 140 is electrically connected to P− well region 160. Thus, P− well region 160 is also at 5 V. The capacitance of control gate capacitor 150 ($C_{CG}$) is much larger than the total capacitance ($C_T$) of tunnel gate capacitor 154, sense transistor gate 152 ($C_{XTR}$), and associated parasitic capacitance. The coupling ratio $C_{CG}/(C_{CG}+C_T C_{XTR})$ is at least 0.8 and preferably 0.9 or greater. The polycrystalline silicon gate layer voltage, therefore, is approximately 4 V to 4.5 V.

A −5 V signal is also applied to the tunnel gate terminal 106. P+ region 142 is electrically connected to P− well region 162 which is, therefore, also at −5 V. An inversion layer is formed adjacent a second part of polycrystalline silicon gate layer 156 at the tunnel gate capacitor 154 below the intervening dielectric region. This dielectric region is preferably silicon dioxide or other suitable dielectric material as is known in the art. N+ region 130 provides a source of electrons for the inversion layer and remains in conductive contact with the inversion layer. Thus, a high electric field is generated across the relatively thin dielectric region sufficient to induce Fowler-Nordheim tunneling of electrons from the inversion layer to the polycrystalline silicon gate layer 156. This relatively higher concentration of electrons significantly increases the threshold voltage of sense transistor 152 and renders it nonconductive in a subsequent read operation.

This EEPROM memory cell offers several advantages over memory cells of the prior art. First, the critical electric field necessary for Fowler-Nordheim tunneling is developed by positive and negative voltages of comparable magnitudes. This avoids the need to generate a high voltage power supply or to incorporate special high voltage transistors in the manufacturing process. Second, programming by Fowler-Nordheim tunneling greatly reduces the power requirement compared to prior art hot carrier generation methods such as avalanche multiplication and band-to-band tunneling. Third, Fowler-Nordheim tunneling from the inversion layer to the polycrystalline silicon gate layer 156 provides uniform current density over the entire area of the tunnel gate capacitor 154. Thus, current density is much less than with methods of the prior art where current flow was through a much smaller area. Such areas were edge-dependent and determined by overlapping gate and underlying implant regions. The reduced programming current density of the present invention greatly increases program/erase cycles and corresponding reliability of the memory cell.

Referring now to FIG. 4, an erase operation of the control gate layer of the memory cell will be explained in detail. FIG. 4 is a schematic diagram of the memory cell of FIGS. 1-2. As previously discussed, N− isolation regions 120 and 126 as well as N+ buried layers 202 and 204 are biased at 5 V throughout the operation. A −5 V signal is applied to control gate terminal 104. P+ region 140 is electrically connected to P− well region 160. Thus, P− well region 160 is also at −5 V. Due to the coupling ratio of control gate capacitor 150 ($C_{CG}$) and the total capacitance ($C_T$) of tunnel gate capacitor 154, sense transistor gate 152, and associated parasitic capacitance the polycrystalline silicon gate layer voltage is approximately −4 V to −4.5 V. The voltage difference across control gate capacitor 150 forms an inversion layer adjacent a first part of polycrystalline silicon gate layer 156 below the intervening dielectric region. The inversion layer is electrically connected to N+ region 122 and, therefore, maintains the high coupling ratio between $C_{CG}$ and $C_T$.

A 5 V signal is also applied to the tunnel gate terminal 106. P+ region 142 is electrically connected to P− well region 162 which is, therefore, also at 5 V. The voltage difference between the polycrystalline silicon gate 156 and the P− well region 162 forms an accumulation region at the lower plate (P− well region 162) of tunnel gate capacitor 154. The resulting high electric field generated across the relatively thin dielectric region is sufficient to induce Fowler-Nordheim tunneling of electrons from polycrystalline silicon gate layer 156 to the accumulation region. Thus, a relatively lower concentration of electrons significantly decreases the threshold voltage of sense transistor 152 and renders it conductive in a subsequent read operation.

The previously discussed advantages of the EEPROM memory cell are also present during an erase operation. The critical electric field necessary for Fowler-Nordheim tunneling is developed by positive and negative voltages of comparable magnitudes. This avoids the need to generate a high voltage power supply or to incorporate special high voltage transistors in the manufacturing process. Programming by Fowler-Nordheim tunneling greatly reduces the power requirement compared to prior art hot carrier generation methods such as avalanche multiplication and band-to-band tunneling. Finally, Fowler-Nordheim tunneling from the polycrystalline silicon gate layer 156 to the accumulation region provides uniform current density over the entire area of the tunnel gate capacitor 154. Thus, current density is much less than with methods of the prior art where current flow was through a much smaller area. Such areas were edge-dependent and determined by overlapping gate and underlying implant regions. The reduced programming current density of the present invention greatly increases program/erase cycles and corresponding reliability of the memory cell.

Figure 5A:
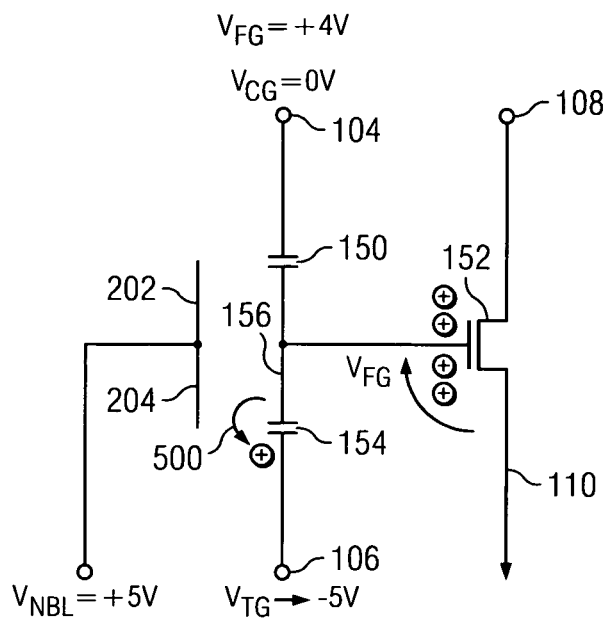
FIG. 5A is a schematic diagram showing stress on an unselected EEPROM cell storing a logical one for $V_{CG}=0$ V and $V_{TG}=-5$ V.

Turning now to FIGS. 5A-5D, stress on unselected memory cells as in FIGS. 1-2 of a memory array during programming of selected memory cells will be discussed in detail. Voltage stress on these unselected memory cells is due to the coupling ratio as previously discussed with regard to FIGS. 3 and 4. In the following discussion it should be understood that this stress may degrade data stored on the unselected memory cells after many programming (or erase) operations are performed on nearby selected memory cells. In particular, FIG. 5A is a schematic diagram showing stress on an unselected EEPROM cell storing a logical one for $V_{CG}=0$ V and $V_{TG}=-5$ V. By way of example, the floating gate voltage ($V_{FG}$) for a logical one is 4 V. When $V_{TG}=-5$ V for programming a selected memory cell, the unselected memory cell of FIG. 5A has approximately −8.5 V across tunnel gate capacitor 154. This stress causes positive charge loss 500 over many programming or erase operations, which greatly reduces the number of memory program/erase cycles and corresponding reliability of the memory cell.

Figure 5B:
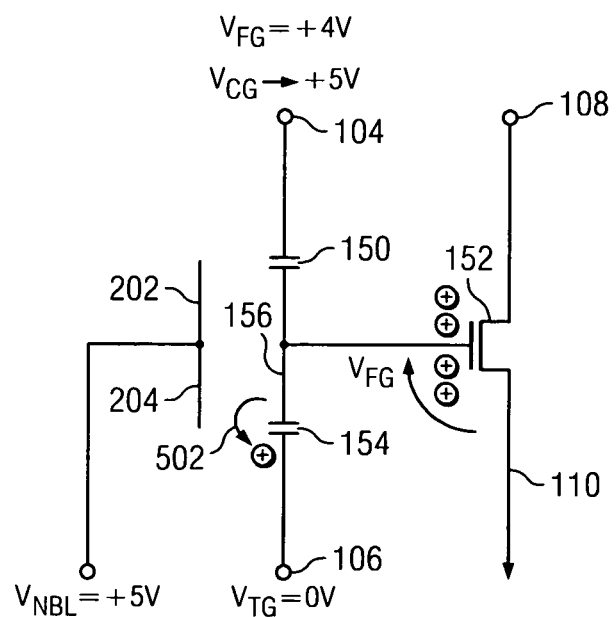
FIG. 5B is a schematic diagram showing stress on an unselected EEPROM cell storing a logical one for $V_{CG}=+5$ V $V_{TG}=0$ V.

Referring to FIG. 5B, there is a schematic diagram showing stress on an unselected EEPROM cell storing a logical one for $V_{CG}=+5$ V and $V_{TG}=0$ V. As previously discussed, the floating gate voltage ($V_{FG}$) for a logical one is 4 V. When $V_{CG}=+5$ V for programming a selected memory cell, the unselected memory cell of FIG. 5B has approximately −8.0 V across tunnel gate capacitor 154. This stress will also cause positive charge loss 502 over many programming or erase operations.

Figure 5C:
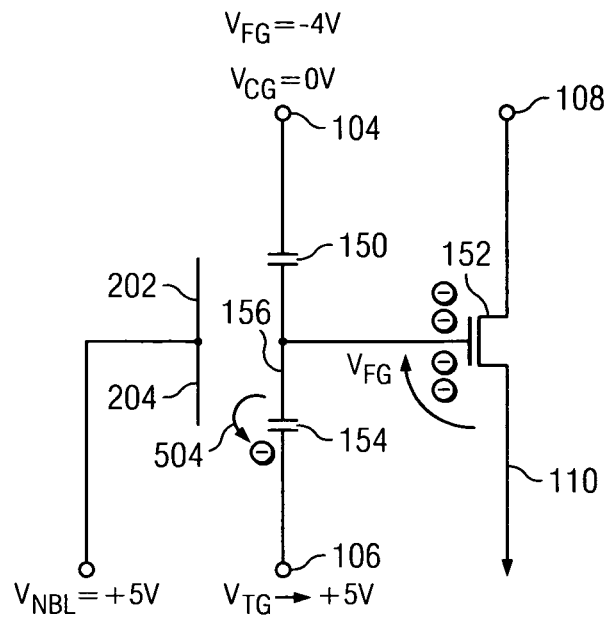
FIG. 5C is a schematic diagram showing stress on an unselected EEPROM cell storing a logical zero for $V_{CG}=0$ V $V_{TG}=+5$ V.

Referring next to FIG. 5C, there is a schematic diagram showing stress on an unselected EEPROM cell storing a logical zero for $V_{CG}=0$ V and $V_{TG}=+5$ V. Here, however, the floating gate voltage ($V_{FG}$) for a logical zero is −4 V. When $V_{TG}=+5$ V for programming a selected memory cell, the unselected memory cell of FIG. 5C again has approximately +8.5 V across tunnel gate capacitor 154. This stress causes negative charge loss 504 over many programming or erase operations, which greatly reduces the number of memory program/erase cycles and corresponding reliability of the memory cell.

Figure 5D:
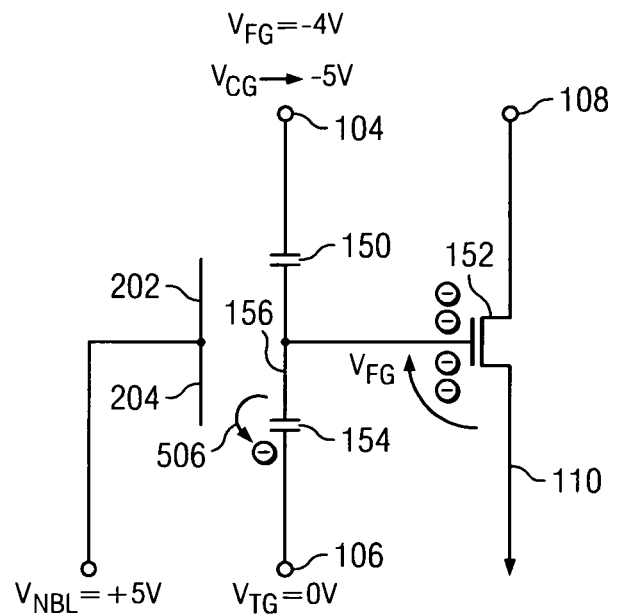
FIG. 5D is a schematic diagram showing stress on an unselected EEPROM cell storing a logical zero for $V_{CG}=-5$ V $V_{TG}=0$ V.

Finally, referring to FIG. 5D, there is a schematic diagram showing stress on an unselected EEPROM cell storing a logical zero for $V_{CG}=-5$ V and $V_{TG}=0$ V. As previously discussed, the floating gate voltage ($V_{FG}$) for a logical zero is −4 V. When $V_{CG}=-5$ V for programming a selected memory cell, the unselected memory cell of FIG. 5D has approximately 9 V across tunnel gate capacitor 154. This stress will also cause negative charge loss 506 over many programming or erase operations.

Figure 6:
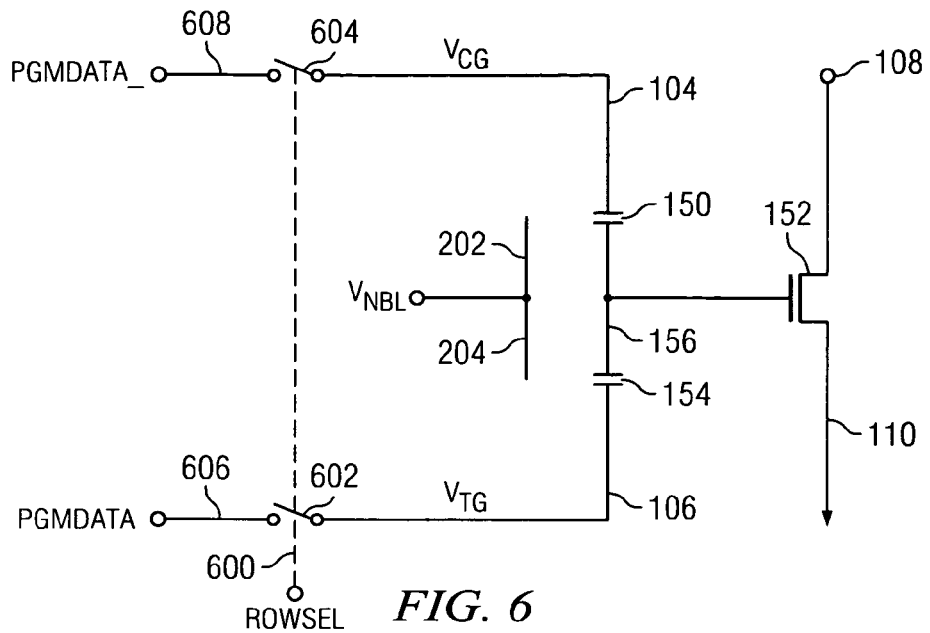
FIG. 6 is a schematic diagram of an EEPROM cell that may be used with an embodiment of the array architecture of the present invention.

Turning now to FIG. 6, there is a schematic diagram of an EEPROM memory cell with surrounding circuitry that forms an element of the array architecture of the present invention. Recall from the previous discussion regarding FIGS. 5A-5D that stress on unselected memory cells occurs when a selected memory cell on the same tunnel gate lead or the same control gate lead is programmed. This stress depends on the voltage applied to the tunnel gate lead or control gate lead as well as the data state of the unselected memory cell. According to the present invention, program data lead 606 is selectively connected to tunnel gate lead 106 by switch 602. Likewise, complementary program data lead 608 is selectively connected to control gate lead 104 by switch 604. Both switches 602 and 604 are controlled by row select signal (ROWSEL) applied to lead 600. Both program data leads 606 and 608 are generally perpendicular to the row select signal in the memory array. Only a selected cell, therefore, will have programming voltages applied to leads 606 and 608 when switches 602 and 604 are turned on by an active row select signal on lead 600. This advantageously eliminates any stress to unselected memory cells that might degrade stored data states.

Figure 7A:
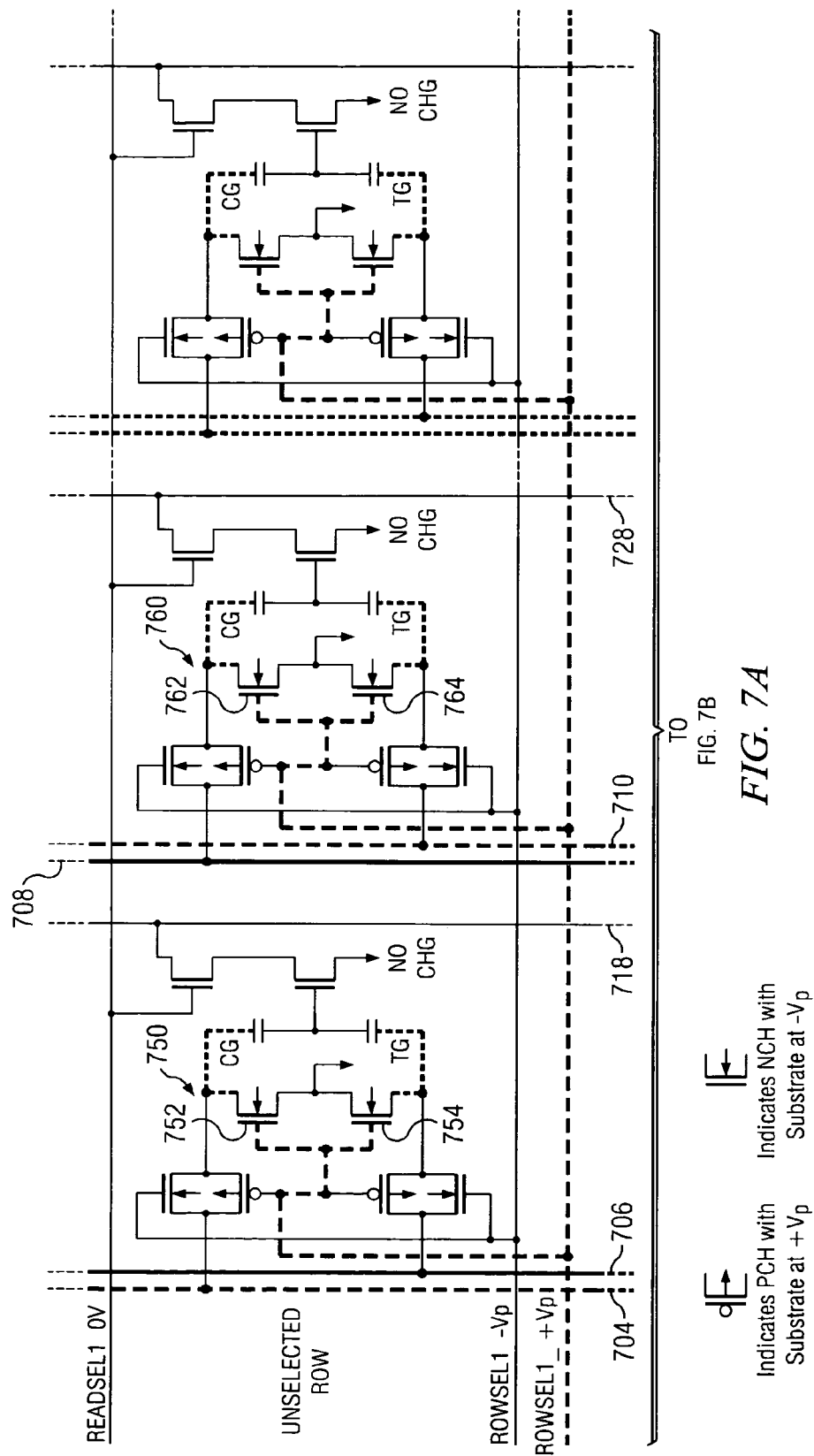
FIG. 7 is a schematic diagram of an embodiment of the array architecture of the present invention.
Figure 7B:
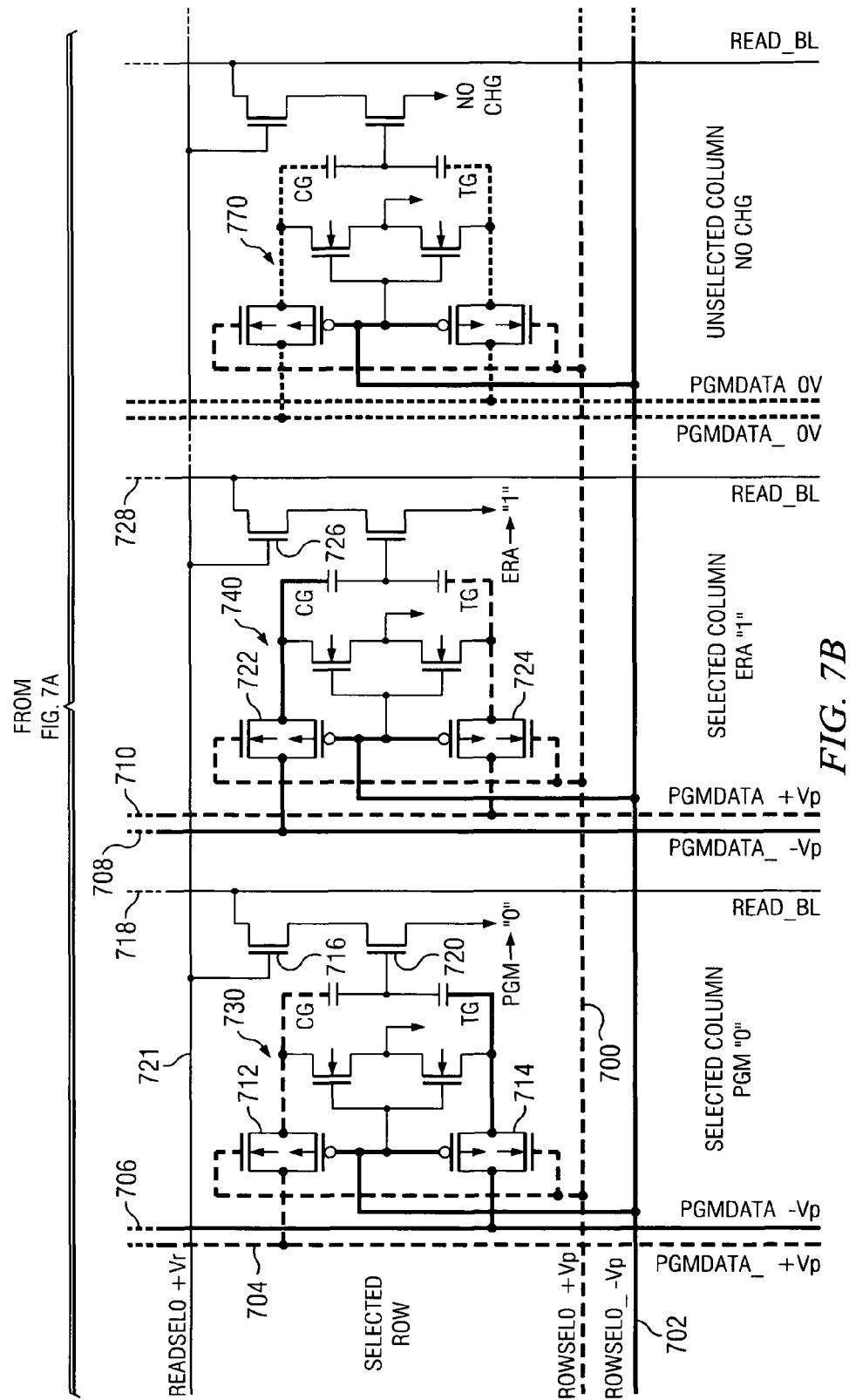

Referring now to FIG. 7, there is a schematic diagram of an embodiment of the array architecture of the present invention. For the purpose of illustration, the memory array includes selected memory cells 730 and 740, which are already programmed to logical zero and one, respectively. The memory array also includes unselected memory cells 750, 760, and 770. Memory cells 730 and 740 are connected to row select leads 700 and 702, which are oriented horizontally through the memory array. Memory cell 730 is connected to program data lines 704 and 706 via switches 712 and 714, respectively. Program data lines 704 and 706 are oriented vertically through the memory array and generally perpendicular to row select leads 700 and 702. Memory cell 740 is connected to program data lines 708 and 710, via switches 722 and 724, respectively. Program data lines 708 and 710 are also oriented vertically through the memory array and generally perpendicular to row select leads 700 and 702. Finally, memory cells 730 and 740 include respective access transistors 716 and 726 to couple their stored data states to respective read bit leads 718 and 728.

Unselected memory cells 750 and 760 share the same program data leads as selected memory cells 730 and 740, respectively. The switches of unselected memory cells 750 and 760, however, share different row select leads from selected memory cells 730 and 740. Thus, the switches of unselected memory cells remain off when selected memory cells 730 and 740 are programmed and are not stressed as previously described with regard to FIGS. 5A-5D. Moreover, the control gate and tunnel gate leads of memory cell 750 are connected to ground or a suitable reference voltage by equalization transistors 752 and 754. Likewise, the control gate and tunnel gate leads of memory cell 760 are connected to ground or the suitable reference voltage by equalization transistors 762 and 764. Unselected memory cells 750 and 760, therefore, are not stressed and their respective data states remain intact when memory cells 730 and 740 are programmed.

Unselected memory cell 770 shares the same row select leads as selected memory cells 730 and 740. The switches of unselected memory cell 770, therefore, are on when the switches of selected memory cells 730 and 740 are on. The program data leads of unselected memory cell 770, however, remain at zero volts or a suitable reference voltage. The control gate and tunnel gate leads of memory cell 770, therefore, are not stressed as previously described with regard to FIGS. 5A-5D.

In a first embodiment of FIG. 7, the switches of each memory cell are formed from complementary metal oxide semiconductor (CMOS) pass gates. Each CMOS pass gate is formed from an N-channel transistor in parallel with a P-channel transistor. Furthermore, in this first embodiment of the present invention, the voltage swing of the control gates of the switches is the same as the voltage swing on the program data leads (+$V_P$ to –$V_P$), so that the switches of unselected cells are completely off when selected memory cells in the same column are programmed.

The maximum voltage across the control gate dielectric of the N-channel and P-channel transistors is generally the same as the programming voltage across the tunnel gate dielectric. This may be acceptable in some applications where programming time of the memory cells is not critical and some Fowler-Nordheim tunneling through the switch transistors is acceptable. In a second embodiment of the present invention, the switch transistors are separately ion implanted to preferentially grow a slightly thicker gate dielectric than that of the tunnel gate capacitors. In this second embodiment, programming voltage across tunnel gate capacitors may be safely increased and programming time decreased without damage to the switch transistors.

Figure 8A:
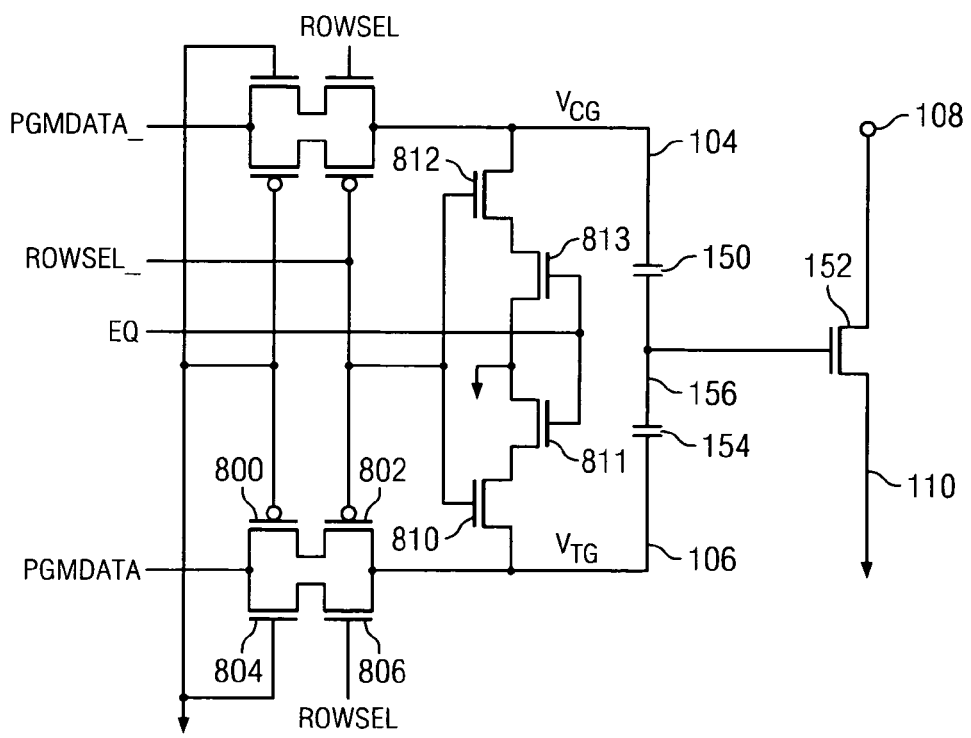
FIG. 8A is a schematic diagram of another EEPROM cell that may be used with another embodiment of the array architecture of the present invention.

Turning now to FIG. 8A, there is a modified memory cell that may be used in a third embodiment of the memory array of FIG. 7. The modified memory cell of FIG. 8A differs from the previously described memory cells of FIG. 7 in three respects. First, each CMOS pass gate or switch now includes series-connected voltage divider transistors such as transistors 800 and 804 as well as switching transistors 802 and 806. Second, row select signal ROWSEL operates at a reduced voltage swing of 0V to 5V (+$V_p$). Complementary row select signal ROWSEL_ operates at a reduced voltage swing of 0V to –5V (–$V_p$). Third, N-channel transistors 811 and 813 are added to the equalization circuit to hold control gate lead 104 and tunnel gate lead 106 to ground (0 V) when the memory cell is unselected.

Figure 8B:
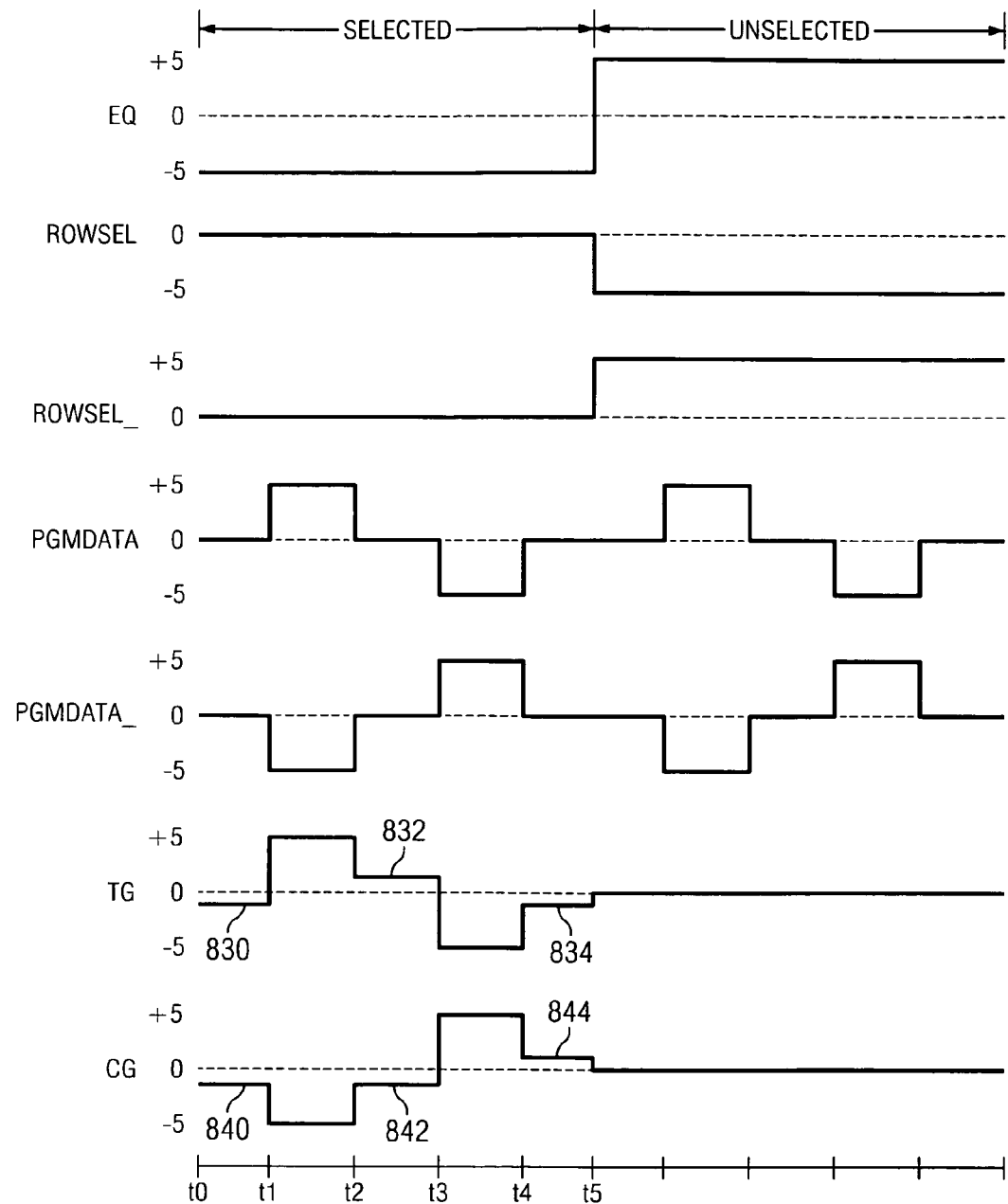
FIG. 8B is a program/erase timing diagram illustrating operation of the cell of FIG. 8A.
Figure 9:
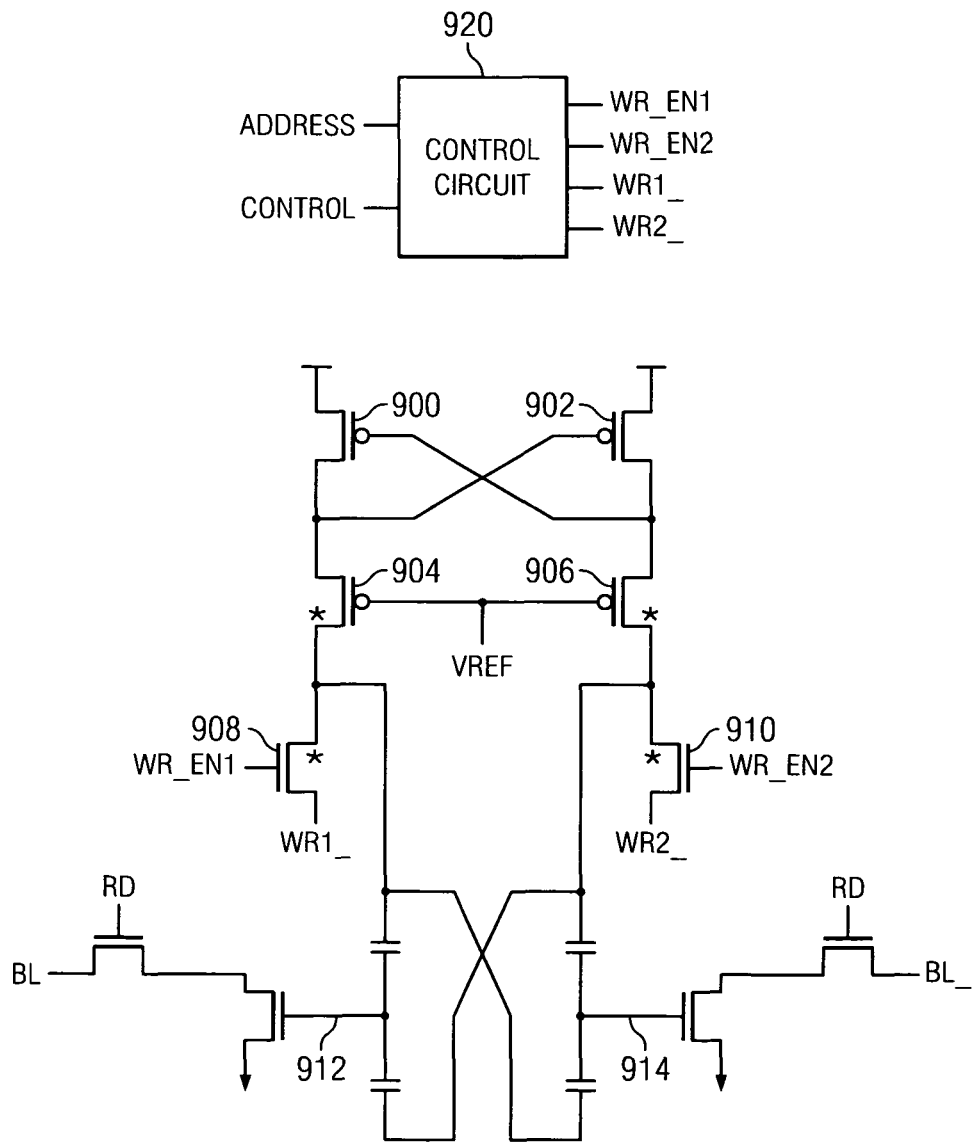
FIG. 9 is a single polycrystalline EEPROM memory cell of the prior art.

Operation of the modified memory cell of FIG. 8A will now be explained in detail with reference to the program/erase timing diagram of FIG. 8B. The left half of the timing diagram (FIG. 8B) illustrates operation when the memory cell is on a selected row. The memory cell row is selected at time t0 when ROWSEL is high (0 V), ROWSEL_ is low (0 V), and EQ is low (–5 V). In this case, leads TG 106 and CG 104 are driven to –$V_{TN}$ as illustrated by voltage levels 830 and 840, respectively, by N-channel transistors of the CMOS switches. At time t1 program data leads PGMDATA and PGMDATA_ of the to memory cell column are driven high and low, respectively, to program a positive charge on floating gate 156. At time t2, PGMDATA and PGMDATA_ return to 0 V. However, TG is pulled down to +$V_{TP}$ 832 by the P-channel transistor of the CMOS switch. Correspondingly, CG is pulled up to –$V_{TN}$ by the N-channel transistor of the CMOS switch. Thus, TG and CG follow PGMDATA and PGMDATA_, respectively, but will only reach +$V_{TP}$ or –$V_{TN}$ depending on the previous voltage level of PGMDATA and PGMDATA_.

At time t3 program data leads PGMDATA and PGMDATA_ of the memory cell column are driven low and high, respectively, to erase the positive charge on floating gate 156. At time t4, PGMDATA and PGMDATA_ return to 0 V. However, TG is pulled up to –$V_{TN}$ 834 by the N-channel transistor of the CMOS switch. Correspondingly, CG is pulled down to +$V_{TP}$ 844 by the P-channel transistor of the CMOS switch. When any cell is on a selected row and PGMDATA and PGMDATA_ are 0 V, therefore, TG and CG will only reach +$V_{TP}$ or –$V_{TN}$ depending on the previous voltage level of PGMDATA and PGMDATA_. This produces a total cell stress equal to a sum of the magnitude of $V_{TP}$+$V_{TN}$ across the floating gate 156. For normal operating parameters, this is approximately 2.5 V compared to a programming voltage of 10 V. At this level, there is negligible effect on the programmed or erased data state. Since ROWSEL and ROWSEL_ are both at 0 V, no more than 5 V appears across any transistor gate oxide of the CMOS switch. Furthermore, the gates of N-channel transistors 810 and 812 are at 0 V while the gates of N-channel transistors 811 and 813 are at –5 V. In this state, if $V_{TG}$ is +5 V, transistor 810 acts as a voltage divider so that the common terminal between transistors 810 and 811 is –$V_{TN}$. Likewise, if $V_{CG}$ is +5 V, transistor 812 acts as a voltage divider so that the common terminal between transistors 812 and 813 is –$V_{TN}$. Therefore, no more than 5 V appears across any transistor gate oxide of the equalization circuit.

Time t5 and beyond represents a cell on an unselected row and a selected column. Here, EQ is high (+5 V), ROWSEL is low (–5 V), and ROWSEL_ is high (+5 V). Both CMOS switches are off. N-channel transistors 810-813 of the equalization circuit are on and drive TG and CG to ground. Thus, voltage levels of PGMDATA and PGMDATA_ have no effect on any memory cell in an unselected row. In this state, transistors 800 and 804 act as voltage dividers for either a positive or negative voltage of PGMDATA. Thus, common terminals between P-channel transistors 800 and 802 or between N-channel transistors 804 and 806 do not exceed a magnitude of $V_{TN}$ or $V_{TP}$. Therefore, no more than 5 V appears across any transistor gate oxide of the CMOS switch for any voltage level of PGMDATA and PGMDATA_.

Still further, while numerous examples have thus been provided, one skilled in the art should recognize that various modifications, substitutions, or alterations may be made to the described embodiments while still falling with the inventive scope as defined by the following claims. For example, inventive concepts of the present invention are readily adapted to alternative switch designs and voltage levels as would be apparent to one of ordinary skill in the art having access to the instant specification. For example, each CMOS pass gate might be replaced by a single N-channel or P-channel transistor with suitable gate voltage levels. Additionally, programming voltages might range from 0 V to 10 V or from 0 V to –10V rather than from –5V to 5 V. Other combinations will be readily apparent to one of ordinary skill in the art having access to the instant specification.

What is claimed is:

1. A memory array, comprising:
   a plurality of nonvolatile memory cells arranged in rows and columns, each memory cell having a first switch, a second switch, an access transistor, and a sense transistor, wherein a current path of each access transistor is connected in series with a current path of each respective sense transistor;
   a bit line connected to the current path of each access transistor in a first column;
   a read select lead connected to a control terminal of each access transistor in a first row;
   a first program data lead connected to the first switch of each memory cell in the first column and coupled to receive one of a first and a second program voltage;
   a control gate capacitor coupled between the first switch and a control terminal of the sense transistor of each respective memory cell, wherein the control gate capacitor being formed on a first portion of a dielectric layer and the sense transistor being formed on a second portion of the dielectric layer;
   a first row select lead coupled to a control terminal of the first switch in each memory cell in the first row, wherein the first switch applies said one of a first and a second program voltage to the control gate capacitor in each respective memory cell in the first row in response to a signal on the first row select lead;

a second program data lead coupled to the second switch of said each memory cell in the first column; and a second row select lead coupled to a control terminal of the second switch in said each respective memory cell in the first row.

2. A memory array as in claim 1, wherein each memory cell comprises:

a tunnel gate capacitor having one terminal connected to the control terminal of a respective sense transistor, wherein the second switch applies another of said one of a first and a second program voltage to the tunnel gate capacitor in each respective memory cell in response to a signal on the second row select lead.

3. A memory array as in claim 2, wherein a common terminal of the tunnel gate capacitor, the control gate capacitor, and the control terminal of the respective sense transistor are formed from a single gate layer.

4. A memory array as in claim 3, wherein the single gate layer is a single polycrystalline silicon layer.

5. A memory array as in claim 1, wherein the plurality of memory cells comprises Electrically Erasable Programmable Read Only Memory (EEPROM) cells.

6. A memory array as in claim 1, wherein the first switch is a Complementary Metal Oxide Semiconductor (CMOS) pass gate.

7. A memory array as in claim 1, wherein the first program voltage has a magnitude substantially equal to a magnitude of the second program voltage, and wherein the first program voltage has a polarity opposite a polarity of the second program voltage.

8. A memory cell, comprising:

a first program data lead coupled to receive one of a first program voltage and a second program voltage;

a first switch connected to the first program data lead and having a control terminal coupled to receive a first row select signal;

a sense transistor having a first portion of a dielectric layer, a control terminal, and a current path; and a control gate capacitor having a second portion of said dielectric layer and being connected between the first switch and the control terminal of the sense transistor, wherein the first switch applies said one of a first program voltage and a second program voltage to the control terminal of the sense transistor in response to the first row select signal.

9. A memory cell as in claim 8, comprising:

a second program data lead coupled to receive another of said one of a first program voltage and a second program voltage;

a second switch connected to the second program data lead and having a control terminal coupled to receive a second row select signal; and a tunnel gate capacitor connected between the second switch and the control terminal of the sense transistor, wherein the second switch applies said another of said one of a first program voltage and a second program voltage to the control terminal of the sense transistor in response to the second row select signal.

10. A memory cell as in claim 8, wherein the memory cell is an Electrically Erasable Programmable Read Only Memory (EEPROM) cell.

11. A memory cell as in claim 9, wherein the control gate capacitor terminal connected to the control terminal of the sense transistor, the tunnel gate capacitor terminal connected to the control terminal of the sense transistor, and the control terminal of the sense transistor are formed from a single gate layer.

12. A memory cell as in claim 11, wherein the single gate layer is a single polycrystalline silicon layer.

13. A memory cell as in claim 8, wherein the first switch is a Complementary Metal Oxide Semiconductor (CMOS) pass gate.

14. A memory array as in claim 8, wherein the first program voltage has a magnitude substantially equal to a magnitude of the second program voltage, and wherein the first program voltage has a polarity opposite a polarity of the second program voltage.

15. A memory array, comprising:

a plurality of nonvolatile memory cells arranged in rows and columns, each memory cell having a first switch, a control gate capacitor, and a sense transistor, the control gate capacitor being formed on a first portion of a dielectric layer and the sense transistor being formed on a second portion of said dielectric layer, wherein the control gate capacitor is coupled between the first switch and a control terminal of the sense transistor of each respective memory cell;

a first program data lead connected to the first switch of each memory cell in a first column, the first program data lead coupled to receive one of a first and a second program voltage; and a first row select lead coupled to a control terminal of the first switch in each memory cell in a first row, wherein the first switch applies said one of a first and a second program voltage to the control gate capacitor in each respective memory cell in response to a signal on the first row select lead.

16. A memory array as in claim 15, wherein each memory cell comprises:

a second switch;

a second program data lead coupled to the second switch of said each memory cell in a first column; and a second row select lead coupled to a control terminal of the second switch in said each memory cell in a first row.

17. A memory array as in claim 16, wherein each memory cell comprises:

a tunnel gate capacitor having one terminal connected to the control terminal of a respective sense transistor, wherein the second switch applies another of said one of a first and a second program voltage to the tunnel gate capacitor in each respective memory cell in response to a signal on the second row select lead.

18. A memory array as in claim 17, wherein a common terminal of the tunnel gate capacitor, the control gate capacitor, and the control terminal of the respective sense transistor are formed from a single gate layer.

19. A memory array as in claim 15, wherein the plurality of memory cells comprises Electrically Erasable Programmable Read Only Memory (EEPROM) cells.

20. A memory array as in claim 15, wherein the switch is a Complementary Metal Oxide Semiconductor (CMOS) pass gate.

21. A memory array as in claim 15, wherein the first program voltage has a magnitude substantially equal to a magnitude of the second program voltage, and wherein the first program voltage has a polarity opposite a polarity of the second program voltage.

* * * * *